United States Patent [19]
Movchan et al.

[11] Patent Number: 5,686,785
[45] Date of Patent: Nov. 11, 1997

[54] ELECTRON GUN HAVING ELECTRICALLY ISOLATED AND ADJUSTABLE CATHODE

[75] Inventors: Boris A. Movchan; Viktor A. Timashov; Evgenii L. Pijuk, all of Kiev, Ukraine

[73] Assignee: Mishznarodnii Zentr Elektronno-Prome-newikh Tekhnologii IES im. E.O. Patona NAN, Kiev, Ukraine

[21] Appl. No.: 503,991

[22] Filed: Jul. 19, 1995

[30] Foreign Application Priority Data

Jul. 20, 1994 [UA] Ukraine .............................. 94076317

[51] Int. Cl.⁶ .................................................. H01J 29/46
[52] U.S. Cl. .......................... 313/453; 313/454; 313/459; 219/121.26; 219/121.27
[58] Field of Search .................................. 313/453, 454, 313/452, 456, 459, 422; 219/121.12, 121.13, 121.16, 121.26, 121.27

[56] References Cited

U.S. PATENT DOCUMENTS

| | | |
|---|---|---|
| 2,090,722 | 8/1937 | Bouwers . |
| 3,483,423 | 12/1969 | Hanks ..................................... 313/453 |
| 3,701,915 | 10/1972 | Tsujimoto . |
| 4,126,811 | 11/1978 | Movchan et al. . |

*Primary Examiner*—Sandra L. O'Shea
*Assistant Examiner*—Matthew J. Esserman
*Attorney, Agent, or Firm*—Chilton, Alix & Van Kirk

[57] ABSTRACT

An electron gun for producing a beam of electrons has an elongated, linear thermionic cathode and a focusing electrode. The opposite ends of the cathode are engaged by adjustable holders which enable the spatial separation between the cathode and focusing electrode to be easily varied. The focusing electrode is electrically isolated from the cathode whereby fine tuning of the electron beam may be accomplished by varying the potential difference between the focusing electrode and cathode.

20 Claims, 3 Drawing Sheets

ELECTRON GUN HAVING ELECTRICALLY ISOLATED AND ADJUSTABLE CATHODE

BACKGROUND OF THE INVENTION

1. Field of the Invention

The present invention relates to enhancing the stability and adjustability of an electron source and, particularly, to the generation of a beam of electrons having a pre-selected focal point and/or cross-sectional area at a "target". More specifically, this invention is directed to an electron gun which employs a linear, adjustable-position thermionic source of electrons and, especially, to such an electron gun wherein the physical relationship between a resiliently supported incandescent cathode and a focusing electrode which is electrically isolated therefrom may be easily and accurately adjusted. Accordingly, the general objects of the present invention are to provide novel and improved methods and apparatus of such character.

2. Description of the Prior Art

Electron guns which provide a high intensity beam of electrons for industrial purposes, for example heating, melting, welding or vaporizing materials in a vacuum chamber, are well known in the art. Such electron guns include an electron emitter, typically a filamentary cathode which is heated to incandescence by means of an electric current, at least a first focusing electrode and a first accelerating electrode. The focusing electrode will typically be positioned "behind" the cathode and will be shaped and electrically biased to provide an electrostatic field which repels the omitted electrons and causes the repelled electrons to be formed into a beam. The accelerating electrode will be positioned at the opposite side of the cathode from the focusing electrode, i.e., downstream of the cathode in the direction of electron travel, and will typically be apertured so that the focused electrons may exit the electron gun as a highly collimated beam. The previously available electron guns have had one or more deficiencies.

An example of a prior art electron gun may be seen from U.S. Pat. No. 4,126,811. In the electron gun of this patent, a linear incandescent cathode is supported, at its opposite ends, by cathode holders. Those holders are mounted on opposite halves of a focusing electrode. The focusing electrode halves, and thus the cathode, are mechanically biased by means of a pair of leaf spring arrangements in the interest of avoiding heat induced distortion of the cathode. Any such distortion will significantly change the spacing between the cathode and focusing electrode and thus change the focal point and/or spot size of the generated electron beam. However, in the arrangement of U.S. Pat. No. 4,126,811, since the energizing current for the cathode is supplied via the leaf spring arrangements, the focusing electrode halves are not electrically isolated from the cathode. Accordingly, focusing can not be optimized because a variable potential difference cannot be established between the cathode and focusing electrode. This is a distinct disadvantage because, over the life of the cathode, there will be a change in the electron optical characteristics, i.e., beam convergence and focal length. Any variations in focal length and beam convergence will have an effect upon beam intensity at the workpiece or target. Restated, an optimum, stable position of the cathode relative to the focusing electrode cannot be guaranteed in the arrangement of U.S. Pat. No. 4,126,811 because the position of the cathode can change with respect to the focusing electrode. Accordingly, the stability and/or repeatability of any process to be carried out using the generated electron beam can not be guaranteed.

A further example of a prior art electron beam gun may be seen from U.S. Pat. No. 3,701,915. In the apparatus disclosed in this patent, a thermionic cathode is clamped between a pair of current carrying leaf springs which, in turn, are supported in a bracket and electrically isolated therefrom. A focusing electrode is also supported from the bracket and electrically isolated from the leaf springs and cathode. While this arrangement permits creation of and variation of a potential difference between the focusing electrode and cathode, the current carrying leaf springs are subject to overheating during operation whereby the position of the cathode relative to the focusing electrode will change. Thus, the above-briefly discussed problems of variation in beam convergence and focal point are present.

SUMMARY OF THE INVENTION

The present invention overcomes the above-briefly discussed and other deficiencies and disadvantages of the prior art by providing an electron gun characterized by an uncomplicated construction, the ability to readily adjust the position of the cathode relative to a focusing electrode and the ability to establish a focusing potential difference between the cathode and focusing electrode. Accordingly, the present invention permits the generation of an electron beam and the exercise of control over that beam such that the work to be accomplished therewith may be performed with predictable repeatability and precision.

In an electron gun in accordance with a preferred embodiment of the invention, the focusing electrode is supported from the electrically conductive frame of a cathode "block" via a rigid current conducting plate while being insulated from the frame. A first of a pair of cathode holders is adjustably supported on the cathode block by means of a leaf spring arrangement so as to apply a resilient axial bias to an elongated thermionic cathode while, at the same time, permitting a first end of the cathode to be moved relative to the focusing electrode. The second cathode holder is fastened to the frame of the cathode block through the use of a second rigid current-conducting plate. The second cathode holder is also movable relative to the focusing electrode. Accordingly, by adjusting the positioning of the two cathode holders, the linear thermionic cathode, i.e., the filament of the electron source, may be positioned relative to the focusing electrode to achieve the desired electron beam characteristics.

In the electron gun of the present invention, as noted above, the focusing electrode is electrically isolated from the cathode thus permitting the application to the focusing electrode of a desired negative focusing potential relative to the potential of the cathode. As also noted above, in accordance with the invention the cathode is stressed, i.e., resiliently biased, in a first direction by means of a single leaf spring arrangement. Accordingly, in comparison with the prior art, the present invention constitutes a less complicated and more reliable design. While less complicated, the design of the present invention readily permits the adjustment of the position of the cathode relative to the focusing electrode. Consequently, an electron gun in accordance with the invention is characterized by increased stability in its electron optical characteristics. This increased stability, in turn, guarantees the reproducability of the processes performed employing the electron beam produced by the electron gun. In particular, in an electron gun in accordance with the invention, it is possible to physically set the position of the cathode relative to the focusing electrode to optimize the process to be performed and, during subsequent operation, the electron beam characteristics may be fine-tuned by varying the focusing potential, particularly the potential difference between the focusing electrode and cathode.

BRIEF DESCRIPTION OF THE DRAWINGS

The present invention may be better understood and its numerous objects and advantages will become apparent to those skilled in the art by reference to the accompanying drawings wherein like reference numerals refer to like elements in the several figures and in which.

DESCRIPTION OF THE DISCLOSED EMBODIMENT

Figure 1:
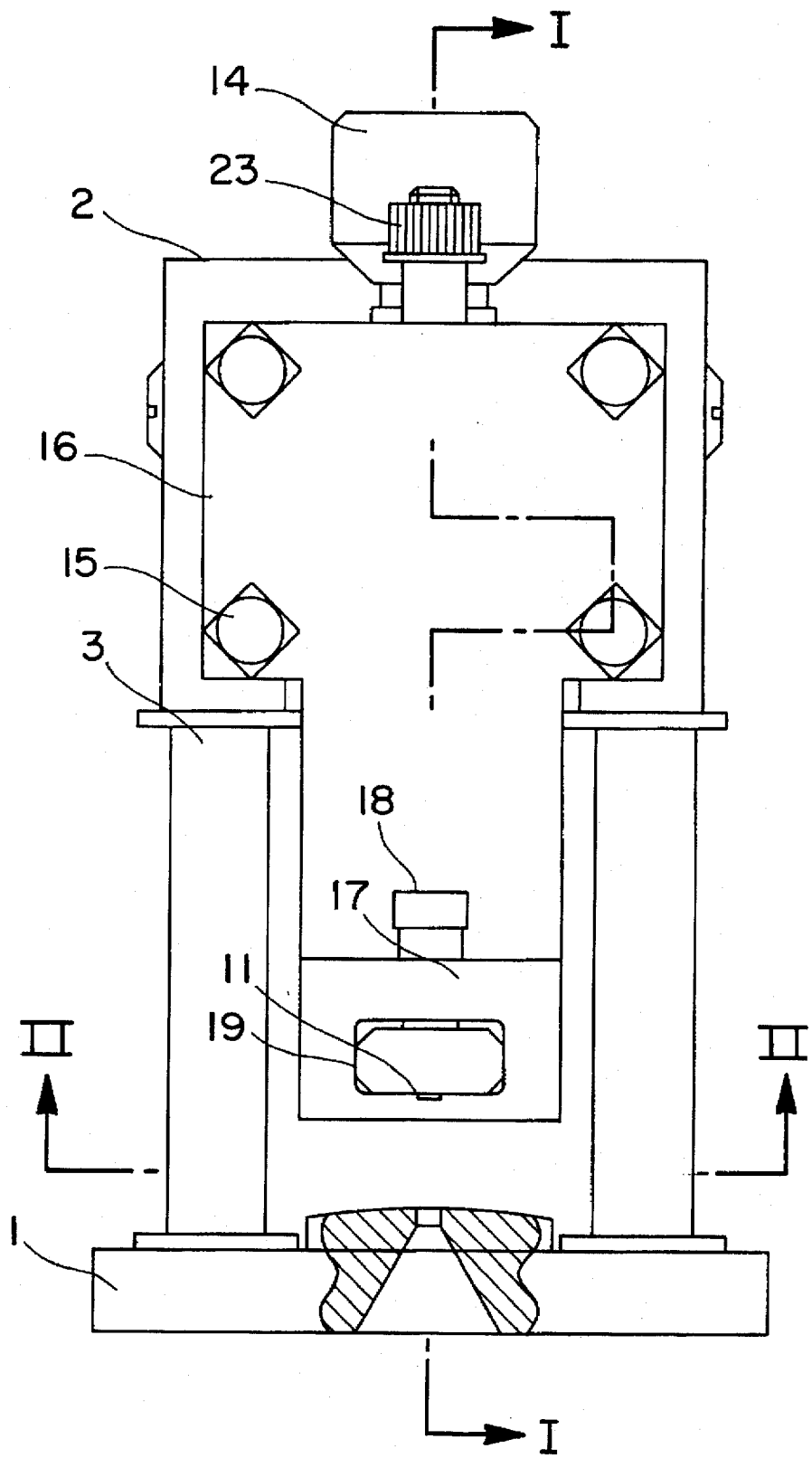
FIG. 1 is a side elevation view, partly in section, of a electron gun in accordance with a first embodiment of the invention.
Figure 3:
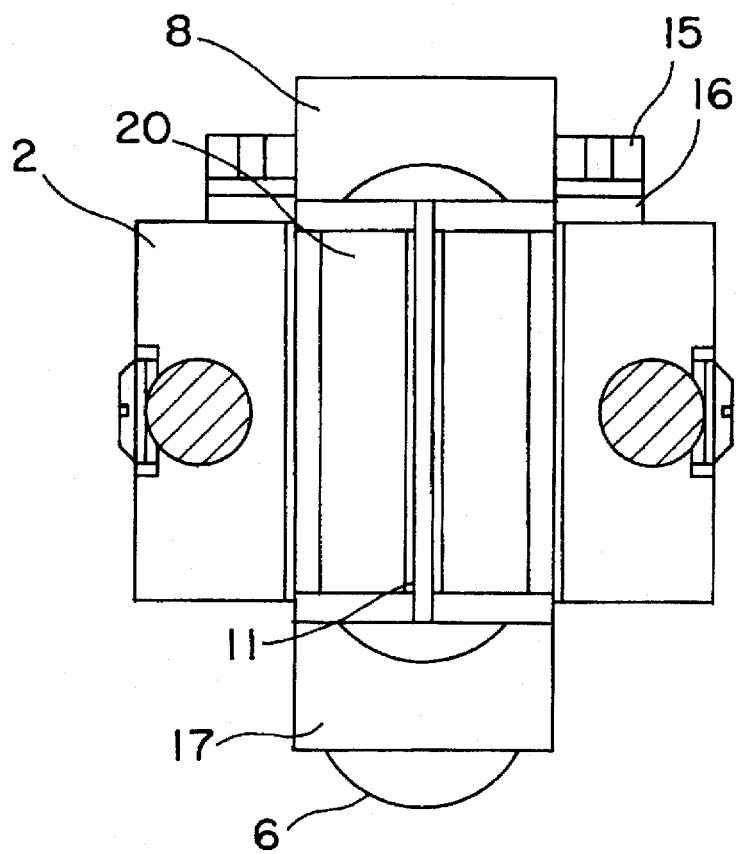
FIG. 3 is a cross-sectional view of the electron gun taken along line II—II of FIG. 1.

An electron gun in accordance with the present invention will typically include an accelerating electrode, i.e., an apertured anode, as indicated at 1. The electron gun will also include a cathode "block". The cathode block will have a frame 2 comprised of a electrically conductive material. The accelerating electrode 1 is integrated with the cathode block, and spaced a predetermined distance therefrom, by means of high voltage insulators 3 (see FIGS. 1 and 3). In addition to frame 2, the cathode block comprises a flat, plate-shaped insulator 4 which is oriented approximately parallel to a plane defined by accelerating electrode 1. A first conductor 5 is supported from insulator 4 and extends to a power supply terminal 6. Conductor 5 defines, at the end thereof disposed oppositely with respect to terminal 6, means for establishing a mechanical and electrical connection between conductor 5 and the first end of a resilient support for a first cathode holder 8. This resilient support comprises a plurality of current-carrying leaf springs 7. As will be described in more detail below, the leaf spring arrangement is connected to conductor 5 by means of a fastener in such a manner as to allow positional adjustment of cathode holder 8 while at the same time ensuring a good electrical connection between conductor 5 and springs 7. Likewise, the connection between the cathode holder 8 and the leaf spring arrangement, the connection including a fastener 10, is adjustable to permit relative movement between the leaf spring arrangement and cathode holder while ensuring that the current flow path therebetween will not be disrupted.

The cathode block also provides support for a filament in the form of a linear thermionic cathode 11. Cathode 11 is secured at one end in cathode holder 8 by means of a clamping plate 13. Clamping plate 13 is caused to tightly engage cathode 11 through the use of a clamping screw 12.

A second power supply terminal 14 is provided directly on the frame 2 of the cathode block. A rigid, current carrying plate 16 extends between frame 2 and a second cathode holder 17. The connection between plate 16 and frame 2 includes a fastener 15 and permits adjustment of plate 16 relative to frame 2 while ensuring the maintenace of a good electrical connection between the frame and plate. The adjustable mechanical connection between plate 16 and frame 2 permits limited movement of cathode holder 17 in the cathode block. The second end of cathode 11 is held in cathode holder 17 by means of a clamping plate 19 which is engaged by a clamping screw 18 mounted in holder 17.

Figure 2:
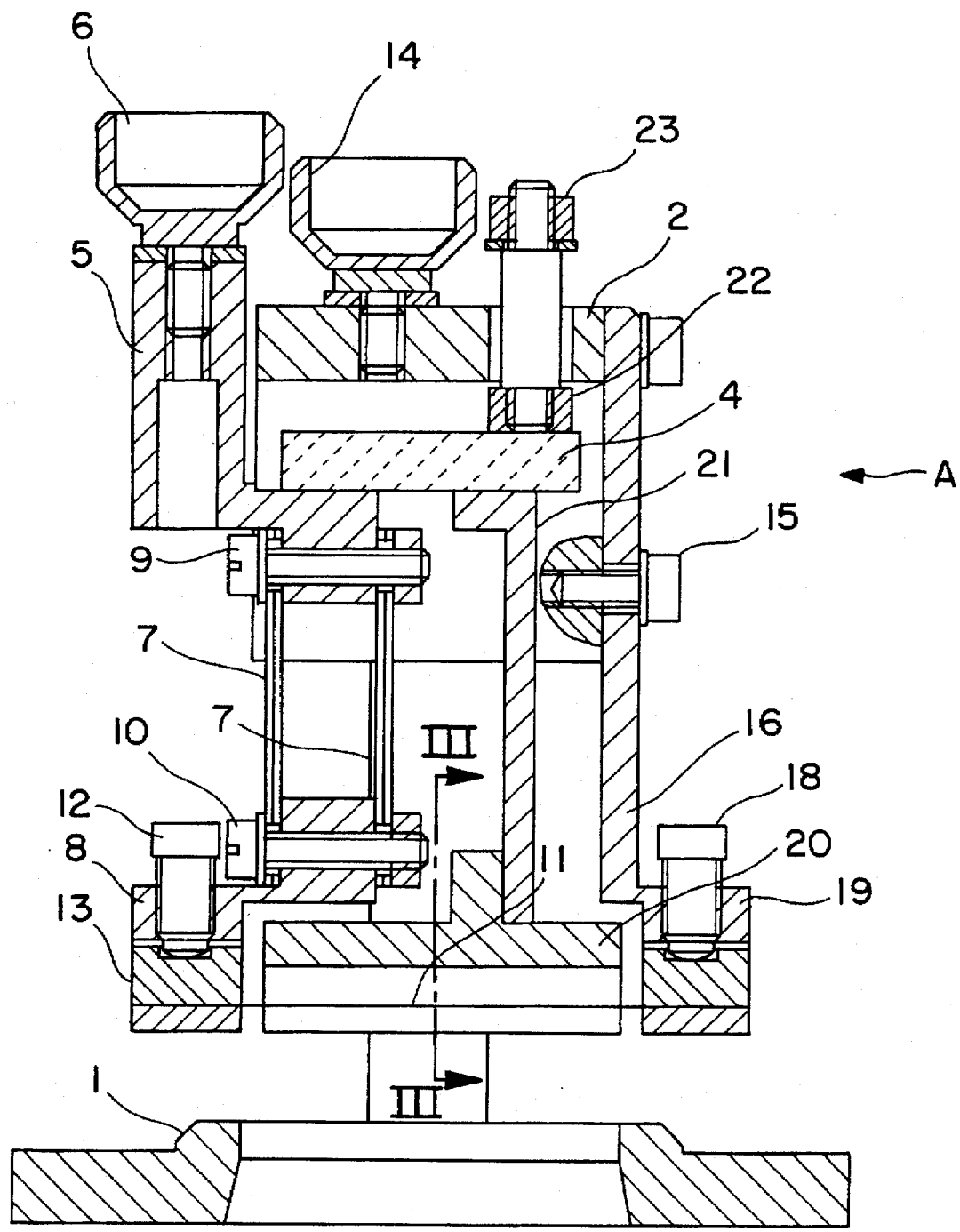
FIG. 2 is a cross-sectional side elevation view, taken along line I—I of FIG. 1, of the electron gun of FIG. 1.

In the disclosed embodiment, the holes in the leaf springs 7 through which the fasteners 9 and 10 extend are shaped so as to permit the above-discussed adjustment. These holes will typically be elongated so that the position of the end of cathode 11 which is engaged by holder 8 may be varied in the vertical direction as the electron gun is shown in FIG. 2. Likewise, the aperture in plate 16 through which the fastener 15 passes will be sized and shaped so as to permit the end of cathode 11 engaged by holder 17 to be moved in the vertical direction as the electron gun is shown in FIG. 2.

The electron gun also comprises a focusing electrode 20 which is mounted on the end of a rigid support plate 21. Electrode 20 is shaped to produce the requisite electrostatic field and, as shown, partly encircles cathode 11 along a substantial portion of its length. Plate 21 includes an aperture through which the insulator 4 extends whereby the support plate is integrated with the cathode block. At the end disposed opposite to the focusing electrode 20, the plate 21 is provided with a boss 22 which receives a threaded, conductive rod extending from a terminal 23. This rod extends through but is electrically isolated from, frame 2. Accordingly, an adjustable focusing potential may be applied to electrode 20 via terminal 23, the conductive rod and conductive plate 21. This focusing potential is completely independent of the potential which will be established on the cathode 11.

Connection of terminals 6 and 14 to terminals of a power supply will complete a circuit which will allow current flow through cathode 11. The current flow path will include terminal 6, conductor 5, the leaf springs 7, cathode holder 8, cathode 11, cathode holder 17, plate 16, frame 2 and terminal 14. The current flow through cathode 11 will result in the heating thereof to a temperature which typically is in the range of 2200° to 2300° C. Cathode 11 will expand linearly as a result of the heating. In order to ensure that the geometry of the electron optical system will not be disturbed by sagging of the expanded cathode, the cathode is permanently stressed. This stressing, i.e., spring biasing of the cathode in the direction of its axis, is accomplished by means of the arrangement of leaf springs 7.

As indicated above, the location of the linear cathode 11 with respect to the focusing electrode 20 to achieve optimum operation is accomplished by setting the position of the cathode holders 8 and 17 relative to the integrated structure comprising the frame 2, conductor 5/terminal 6 and insulator plate 4. In the case of cathode holder 8, the repositioning is accomplished by loosening of one or both of screws 9, 10 and subsequently retightening. In the case of cathode holder 17, the positional adjustment is accomplished through the use of the screw 15.

Figure 4:
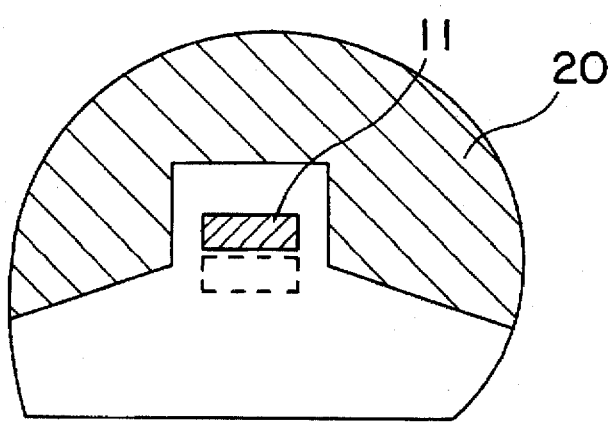
FIG. 4 is partial sectional view of the electron gun of FIGS. 1-3, FIG. 4 being a view taken along line III—III of FIG. 2.

Two possible positions of cathode 11 relative to focusing electrode 20 are represented in FIG. 4 respectively by continuous and broken lines.

Subsequent to the mechanical adjustment of the position of the cathode relative to the focusing electrode, and particularly to refocus the electron beam and correct the electron optical characteristics during use, such refocusing and/or correction possibly being necessitated by thermal expansion of components of the electron gun, a potential which is negative with respect to that appearing on cathode 11 will be applied to focusing electrode 20 via terminal 23. The magnitude of the potential difference between electrode 20 and cathode 11 can, for example, be used to change the focal distance of the electron beam and thus the size of the area of the work on which the electron beam impinges.

As noted above, the holes through which the screws 9, 10 and 15 pass, respectively in the leaf spring arrangement and plate 16, can be of elongated shape. As will be obvious to those skilled in the art, additional means may be incorporated for varying the relative position of the cathode 11 with respect to the surface(s) of focusing electrode 20. Likewise, it will be obvious to those skilled in the art that cathodes having configurations which are other than a single filament, as shown, may be utilized. For example, cathode 11 can be in the form of a pair of parallel, linear filaments.

While preferred embodiments have been shown and/or described, various modifications and substitutions may be made thereto without departing from the spirit and scope of the invention. Accordingly, it is to be understood that the present invention has been described by way of illustration and not limitation.

What is claimed is:

1. An electron gun comprising:
   an elongated thermionic source of electrons, said source defining an axis and having oppositely disposed first and second end portions;
   housing means;
   a first electrically conductive holder for engaging and supporting said first end portion of said electron source;
   first mounting means for adjustably mounting said first holder from said housing means, said first mounting means being at least in part electrically conductive whereby current for heating said electron source may flow through said first mounting means and first holder;
   a second electrically conductive holder for engaging and supporting said second end portion of said electron source;
   second adjustable mounting means for resiliently mounting said second holder from said housing means, said second mounting means being at least in part electrically conductive whereby current for heating said electron source may flow through said second mounting means and second holder;
   insulating means carried by said housing means for electrically isolating said first mounting means from said second mounting means;
   a focusing electrode positioned in proximity to and spaced from said electron source, said focusing electrode extending along a substantial portion of the length of said electron source in the region disposed between said holders, said focusing electrode having a surface which is substantially parallel to the axis defined by said elongated electron source;
   means for supporting said focusing electrode from said housing means, said supporting means engaging said insulating means whereby said focusing electrode support is electrically isolated from said electron source; and
   at least a first accelerating electrode, said first accelerating electrode being positioned a predetermined distance from said electron source in the direction of travel of electrons focused by the action of said focusing electrode, said accelerating electrode being electrically isolated from said electron source and focusing electrode.

2. The electron gun of claim 1 wherein said housing means includes conductive frame means, one of said mounting means being mechanically and electrically coupled to said frame means.

3. The electron gun of claim 2 wherein said one mounting means is said first mounting means and includes:
   a conductive plate, said plate having oppositely disposed first and second end portions, said first holder bring affixed to said first end portion of said conductive plate; and
   means for adjustably attaching said second end portion of said conductive plate to said frame means, said adjustable means including a fastener which engages said frame means, said fastener having a diameter and passing through an opening in said conductive plate, said opening having at least one dimension which is larger than said fastener diameter whereby the position of said first holder relative to said focusing electrode may be varied.

4. The electron gun of claim 2 wherein the other of said mounting means is said second mounting means and includes:
   at least a first electrically conductive leaf spring, said spring having oppositely disposed first and second end portions;
   means for mechanically connecting said second holder to said first end portion of said spring;
   first power supply terminal means affixed to said housing means and electrically isolated from said frame means by said insulating means; and
   means for mechanically connecting said second end portion of said spring to said first terminal; wherein at least one of said mechanical connecting means is adjustable to vary the position of said second holder relative to said focusing electrode.

5. The electron gun of claim 3 wherein the other of said mounting means is said second mounting means and includes:
   at least a first electrically conductive leaf spring, said spring having oppositely disposed first and second end portions;
   means for mechanically connecting said second holder to said first end portion of said spring;
   first power supply terminal means affixed to said housing means and electrically isolated from said frame means by said insulating means; and
   means for mechanically connecting said second end portion of said spring to said first terminal; wherein at least one of said mechanical connecting means is adjustable to vary the position of said second holder relative to said focusing electrode.

6. The electron gun of claim 5 wherein said mechanical connecting means each includes a fastener, said fasteners each having a diameter and passing through a cooperating opening in said spring, said openings having at least one dimension which is larger than the diameter of the associated of said fasteners whereby both of said mechanical connecting means are adjustable.

7. The electron gun of claim 2 wherein said insulating means comprises a rigid, flat plate formed of non-conductive material, said supporting means engaging said non-conductive plate.

8. The electron gun of claim 1 further comprising means for applying a focusing potential to said supporting means whereby a potential difference between said electron source and focusing electrode may be established and varied.

9. The electron gun of claim 2 further comprising means for applying a focusing potential to said supporting means whereby a potential difference between said electron source and focusing electrode may be established and varied.

10. The electron gun of claim 3 further comprising means for applying a focusing potential to said supporting means whereby a potential difference between said electron source and focusing electrode may be established and varied.

11. The electron gun of claim 4 further comprising means for applying a focusing potential to said supporting means whereby a potential difference between said electron source and focusing electrode may be established and varied.

12. The electron gun of claim 5 further comprising means for applying a focusing potential to said supporting means whereby a potential difference between said electron source and focusing electrode may be established and varied.

13. The electron gun of claim 6 further comprising means for applying a focusing potential to said supporting means whereby a potential difference between said electron source and focusing electrode may be established and varied.

14. The electron gun of claim 3 wherein said insulating means comprises a rigid, flat plate formed of non-conductive material, said supporting means engaging said non-conductive plate.

15. The electron gun of claim 9 wherein said insulating means comprises a rigid, flat plate formed of non-conductive material, said supporting means engaging said non-conductive plate.

16. The electron gun of claim 12 wherein said insulating means comprises a rigid, flat plate formed of non-conductive material, said supporting means engaging said non-conductive plate.

17. The electron gun of claim 16 wherein said mechanical connecting means each includes a fastener, said fasteners each having a diameter and passing through a cooperating opening in said spring, said openings having at least one dimension which is larger than the diameter of the associated of said fasteners whereby both of said mechanical connecting means are adjustable.

18. The electron gun of claim 6 wherein said openings in said plate and spring are all elongated in a direction generally transverse to said electron source axis whereby said electron source is movable toward and away from said focusing electrode.

19. The electron gun of claim 17 wherein said openings in said plate and spring are all elongated in a direction generally transverse to said electron source axis whereby said electron source is movable toward and away from said focusing electrode.

20. The electron gun of claim 19 wherein said electron source is a cathode which is linear in the unheated state and wherein the linearity of said cathode when heated to incandescence is maintained by a resilient bias provided by said spring.

* * * * *